(12) United States Patent
Tiwari et al.

(10) Patent No.: US 8,080,839 B2
(45) Date of Patent: Dec. 20, 2011

(54) ELECTRO-MECHANICAL TRANSISTOR

(75) Inventors: Sandip Tiwari, Ithaca, NY (US);
Moon-Kyung Kim, Ithaca, NY (US);
Joshua Mark Rubin, Ithaca, NY (US);
Soo-Doo Chae, Yongin-si (KR);
Choong-Man Lee, Seoul (KR);
Ravishankar Sundararaman, Ithaca, NY (US)

(73) Assignee: Samsung Electronics Co. Ltd., Suwon-Won Si (KR)

( * ) Notice: Subject to any disclaimer, the term of this patent is extended or adjusted under 35 U.S.C. 154(b) by 139 days.

(21) Appl. No.: 12/549,906

(22) Filed: Aug. 28, 2009

(65) Prior Publication Data

US 2011/0049650 A1    Mar. 3, 2011

(51) Int. Cl.
*H01L 29/84* (2006.01)

(52) U.S. Cl. .................. 257/288; 257/415; 257/E29.04; 257/E29.324

(58) Field of Classification Search .................. 257/288, 257/415, E29.324, E29.04
See application file for complete search history.

(56) References Cited

U.S. PATENT DOCUMENTS

| | | | | |
|---|---|---|---|---|
| 4,893,156 A | * | 1/1990 | Karasawa | 257/401 |
| 5,702,281 A | * | 12/1997 | Huang et al. | 445/50 |
| 5,710,478 A | * | 1/1998 | Kanemaru et al. | 313/336 |
| 6,946,693 B1 | * | 9/2005 | Scheible et al. | 257/213 |
| 7,214,571 B2 | * | 5/2007 | Scheible et al. | 438/144 |
| 7,355,258 B2 | | 4/2008 | Valenzuela | |
| 7,414,437 B1 | * | 8/2008 | Blick et al. | 326/101 |
| 2006/0011998 A1 | * | 1/2006 | Scheible et al. | 257/414 |
| 2008/0049491 A1 | | 2/2008 | Park | |
| 2008/0061351 A1 | | 3/2008 | Jang et al. | |
| 2010/0032739 A1 | * | 2/2010 | Lindholm et al. | 257/296 |
| 2010/0171569 A1 | * | 7/2010 | Ionescu et al. | 333/185 |

FOREIGN PATENT DOCUMENTS

| | | |
|---|---|---|
| KR | 10-0745769 | 7/2007 |
| KR | 10-0807222 | 2/2008 |

OTHER PUBLICATIONS

English Abstract for Publication No. 10-0745769.
English Abstract for Publication No. 1020080017784 (for 10-0807222).

* cited by examiner

*Primary Examiner* — Victor A Mandala
(74) *Attorney, Agent, or Firm* — F. Chau & Associates, LLC (57) ABSTRACT

An electro-mechanical transistor includes a source electrode and a drain electrode spaced apart from each other. A source pillar is between the substrate and the source electrode. A drain pillar is between the substrate and the drain electrode. A moveable channel is spaced apart from the source electrode and the drain electrode. A gate nano-pillar is between the moveable channel and the substrate. A first dielectric layer is between the moveable channel and the gate nano-pillar. A second dielectric layer is between the source pillar and the source electrode. A third dielectric layer is between the drain pillar and the drain electrode.

14 Claims, 13 Drawing Sheets

ELECTRO-MECHANICAL TRANSISTOR

BACKGROUND

The present disclosure relates to semiconductor devices, and more particularly, to an electro-mechanical transistor.

Metal-oxide-semiconductor field effect transistors (MOSFETs) are used in many electronic devices or systems. However, when electronic devices are scaled down, the conventional MOSFET incurs problems such as short channel effect and junction leakage current.

SUMMARY

The present invention provides an electro-mechanical transistor capable of scaling down.

In accordance with an exemplary embodiment of the present invention electro-mechanical transistor is provided which includes a source electrode and a drain electrode spaced apart from each other. A source pillar is between a substrate and the source electrode. A drain pillar is between a substrate and the drain electrode. A moveable channel is spaced apart from the source electrode and the drain electrode. A gate electrode, in the form of a nano-pillar, is between the moveable channel and the substrate. A first dielectric layer is between the moveable channel and the nano-pillar. A second dielectric layer is between the source pillar and the source electrode. A third dielectric layer is between the drain pillar and the drain electrode.

The source electrode and the drain electrode may be electrically connectable to the moveable channel as a result of movement of the moveable channel caused by an electrostatic force generated by applying a turn-on voltage to the gate nano-pillar.

The gate nano-pillar may be a flexible material that is bendable in response to electrostatic force.

The gate nano-pillar may include a flexible part extending from the substrate. A capacitive coupling part may contact the flexible part. The cross-sectional area of the capacitive coupling part may be greater than that of the flexible part.

The electro-mechanical transistor may further include a side gate electrode on the substrate. The side gate electrode may face the source electrode and the drain electrode. The moveable channel may be interposed between the source electrode and the side gate electrode, and between the drain electrode and the side gate electrode.

The side gate electrode may create an additional electrostatic force by applying the turn-on voltage to the side gate electrode.

The additional electrostatic force can restore the moveable channel when the moveable channel is in contact with the source electrode and the drain electrode.

The source electrode, the drain electrode, the gate nano-pillar, and the moveable channel may form a memory cell.

The memory cell may retain a state using stiction force and molecular force so as to maintain physical contact resulting from an electrostatic force generated by applying a turn-on voltage to the gate nano-pillar.

In accordance with an exemplary embodiment of the present invention an electro-mechanical transistor is provided which includes a substrate, a source electrode on a source pillar that separates the source electrode from the substrate, a drain electrode on a drain pillar that separates the drain electrode from the substrate and from the source electrode, a gate electrode on a gate pillar that separates the gate electrode from the substrate and from the source electrode and the drain electrode. The gate pillar is a flexible material such that the gate pillar is bendable toward the source electrode and toward the drain electrode by an electrostatic force that is generated when a turn-on voltage is applied to the gate pillar.

When the turn-on voltage is applied to the gate pillar, the gate pillar may be bendable toward the source electrode and toward the drain electrode such that the gate electrode contacts the source electrode and the drain electrode.

The electro-mechanical transistor may further include a source dielectric layer between the source electrode and the source pillar, a drain dielectric layer between the drain electrode and the drain pillar, and a gate dielectric layer between the gate electrode and the gate pillar.

In accordance with an exemplary embodiment of the present invention an electro-mechanical transistor includes a substrate, a source electrode on a source pillar that separates the source electrode from the substrate, a drain electrode on a drain pillar that separates the drain electrode from the substrate and from the source electrode, a first gate electrode on a first gate pillar that separates the gate electrode from the substrate and from the source electrode and the drain electrode, and a second gate electrode on a second gate pillar. The first gate electrode is located between the second gate electrode and the source electrode, and between the second gate electrode and the drain electrode. The first gate pillar is a flexible material such that the first gate pillar is bendable toward the source electrode and toward the drain electrode by an electrostatic force that is generated when a turn-on voltage is applied to the first gate pillar. The second gate electrode provides a restoring electrostatic force when the turn-on voltage is applied to the second gate pillar.

When the turn-on voltage is applied to the first gate pillar, the first gate pillar may be bendable toward the source electrode and toward the drain electrode such that the gate electrode contacts the source electrode and the drain electrode.

The electro-mechanical transistor may further include a source dielectric layer between the source electrode and the source pillar, a drain dielectric layer between the drain electrode and the drain pillar, a first gate dielectric layer between the first gate electrode and the first gate pillar, and a second dielectric layer between the second gate electrode and the second gate pillar.

DETAILED DESCRIPTION

In the figures, the dimensions of layers and regions are exaggerated for clarity of illustration. Like reference numerals refer to like elements throughout.

Referring now to FIGS. 1 through 5, the electro-mechanical transistor according to an exemplary embodiment of the present invention is described. A source electrode 140 and a drain electrode 160 are spaced apart from each other on a substrate 100. The substrate 100 is a semiconductor substrate. The moveable channel (gate) 120 is disposed on the substrate. A gate nano-pillar 110 is disposed between the moveable channel 120 and the substrate 100. A first dielectric layer 115 is disposed between the moveable channel 120 and the gate nano-pillar 110.

The moveable channel 120 faces the source electrode 140 and the drain electrode 160. The moveable channel 120, the source electrode 140 and the drain electrode 160 are a conductive material. In exemplary embodiments, the moveable channel 120, the source electrode 140 and the drain electrode 160 are one of metal, conductive polymer, or doped silicon. In an exemplary embodiment, the moveable channel 120, the source electrode 140 and the drain electrode 160 are aluminum.

The first dielectric layer 115 is an insulating layer. In an exemplary embodiment, the first dielectric layer 115 is a silicon nitride layer. The gate nano-pillar 110 is a flexible material that is bendable in response to an electrostatic force. In an exemplary embodiment the gate nano-pillar 110 is of the same material as the moveable channel 120, for example, a conductive material. The gate nano-pillar 110 can also be one of various materials such as polymer, a silicon oxide layer, polysilicon, amorphous silicon, photoresist, or a nanotube.

A source pillar 130 is disposed between the substrate 100 and the source electrode 140. A drain pillar 150 is disposed between the substrate 100 and the drain electrode 160. The source pillar 130 and the drain pillar 150 are of the same material as the gate nano-pillar 110. A second dielectric layer 135 is disposed between the source pillar 130 and the source electrode 140. A third dielectric layer 155 is disposed between the drain pillar 150 and the drain electrode 160. The second dielectric layer 135 and the third dielectric layer 155 are of the same material as the first dielectric layer 115. In an exemplary embodiment, the second dielectric layer 135 and the third dielectric layer 155 are a silicon nitride layer.

The method of operating an electro-mechanical transistor according to the exemplary embodiment of the present invention depicted in FIGS. 1 through 5 will now be described.

Figure 1:
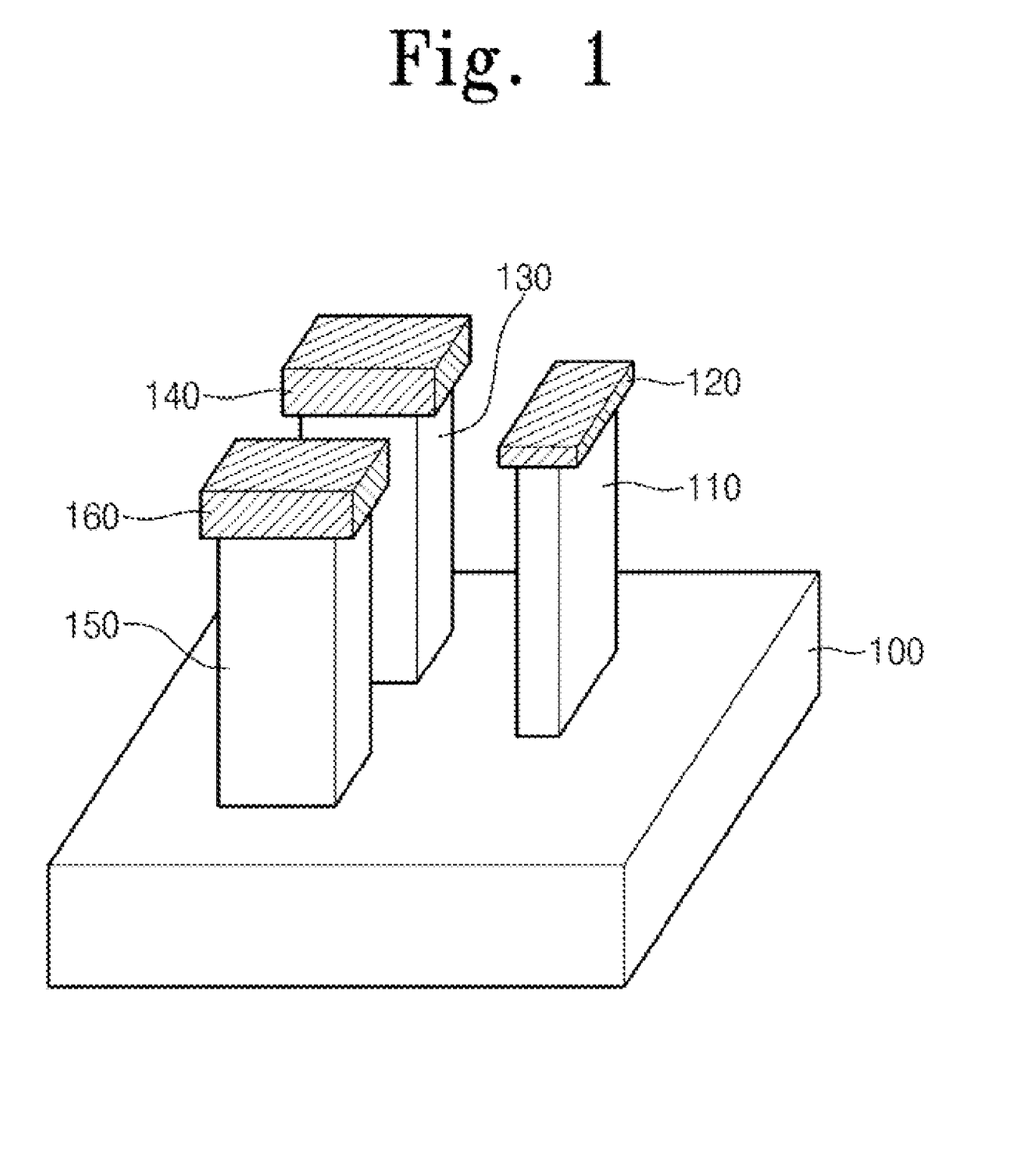
FIG. 1 is a view illustrating an electro-mechanical transistor according to an exemplary embodiment of the present invention.
Figure 2:
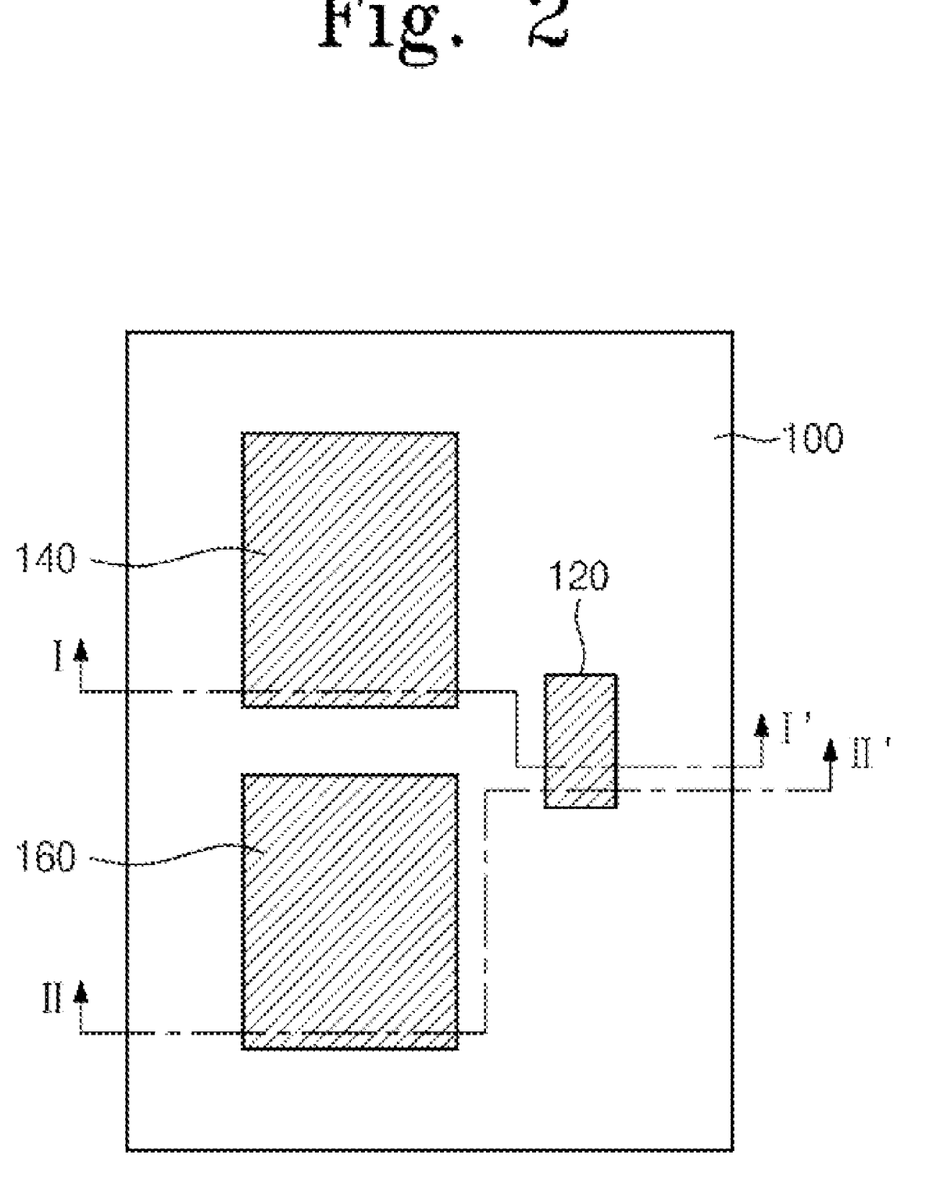
FIG. 2 is a top plan view illustrating an electro-mechanical transistor according to an exemplary embodiment of the present invention.
Figure 3A:
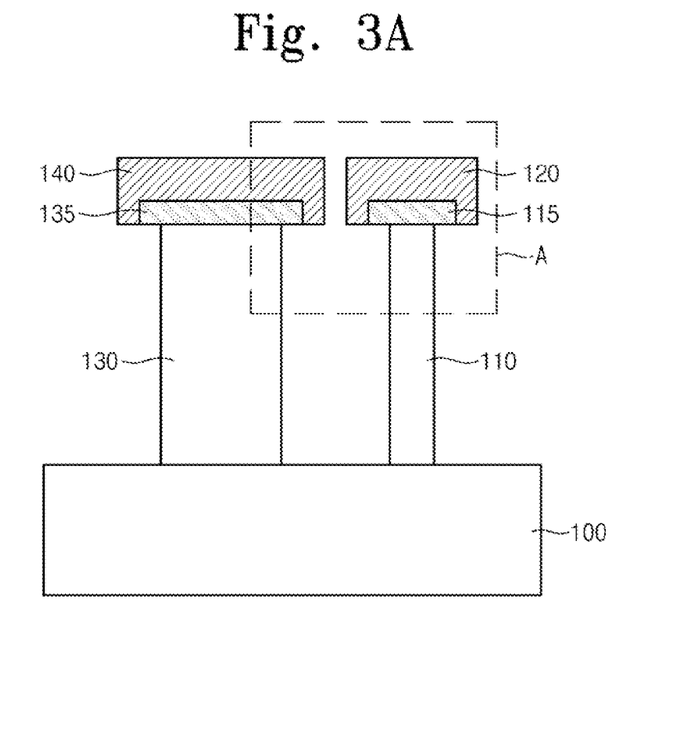
FIGS. 3A and 3B are cross sectional views of an exemplary embodiment taken along line I-I' and along line II-II' of FIG. 2, respectively.
Figure 3B:
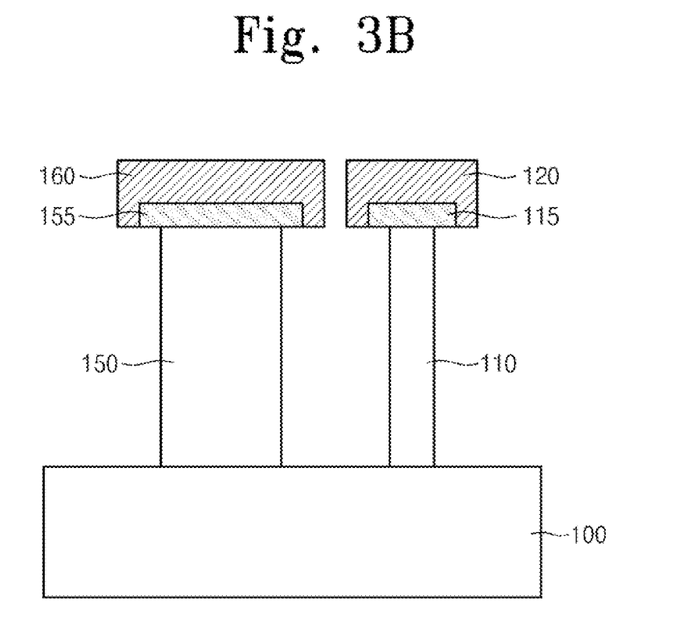
Figure 4:
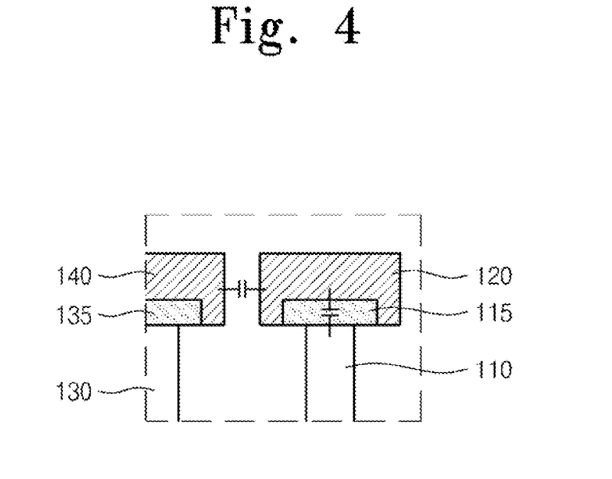
FIG. 4 is a view illustrating the capacitance of portion A depicted in FIG. 3A.

By applying a turn-on voltage to the gate nano-pillar 110, the gate nano-pillar 110 establishes the moveable channel 120 at a voltage near the turn-on voltage. The voltage of the moveable channel 120 is fixed by the capacitive divider as shown in FIG. 4. The gate nano-pillar 110 is capacitively coupled to the moveable channel 120, thereby charge is induced on the moveable channel 120. The voltage of the moveable channel 120 is established so that an electrostatic force is generated between the source and drain electrodes 140, 160 and the moveable channel 120.

Figure 5:
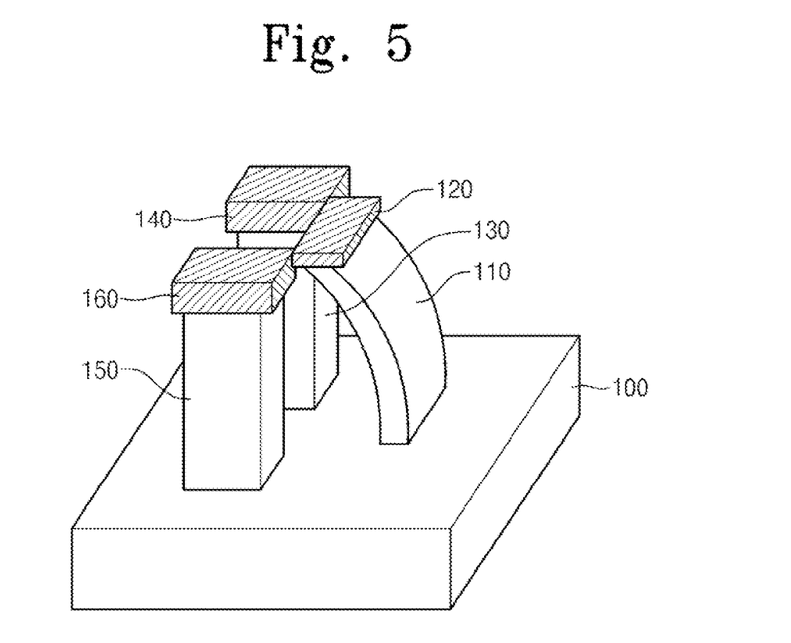
FIG. 5 is a depiction of the result of the method of operating an electro-mechanical transistor according to an exemplary embodiment of the present invention.

The electrostatic force causes the moveable channel 120 to move toward the source and drain electrodes 140, 160. As a result of the movement of the moveable channel 120, the source electrode 140 and the drain electrode 160 can be in electrical contact with the moveable channel 120 as shown in FIG. 5.

Once contact is made between the source and drain electrodes 140, 160 and the moveable channel 120, the moveable channel 120 may quickly attain the same voltage as the source and drain electrodes 140, 160. That is, no net electrostatic force would then exist between the source and drain electrodes 140, 160 and the moveable channel 120. Consequently, a restoring force of the gate nano-pillar 110 can pull the moveable channel 120 away from the source and drain electrodes 140, 160, at which point an electrostatic force can be re-introduced under the influence of the gate nano-pillar 110. As a result of the restoring movement of the moveable channel 120, the source electrode 140 and the drain electrode 160 can be electrically disconnected from the moveable channel 120.

Figure 6A:
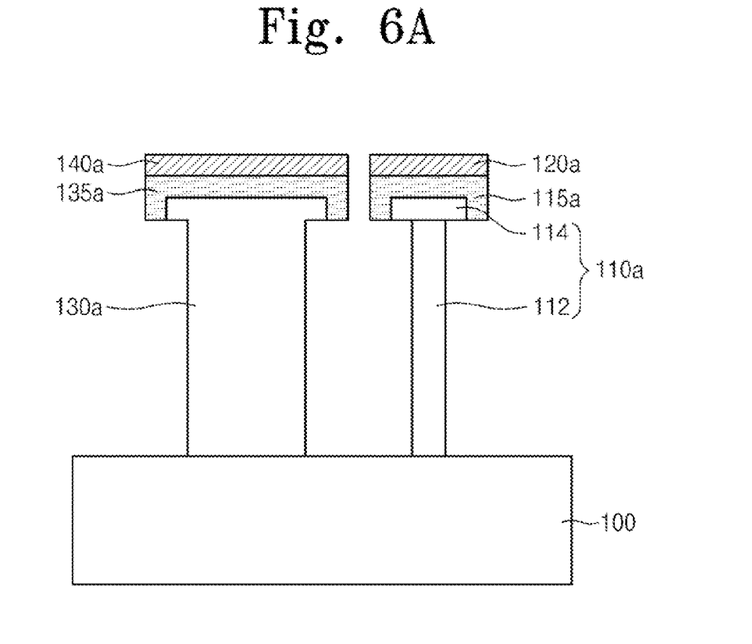
FIGS. 6A and 6B are cross sectional views of an exemplary embodiment taken along line I-I' and along line II-II' of FIG. 2, respectively.
Figure 6B:
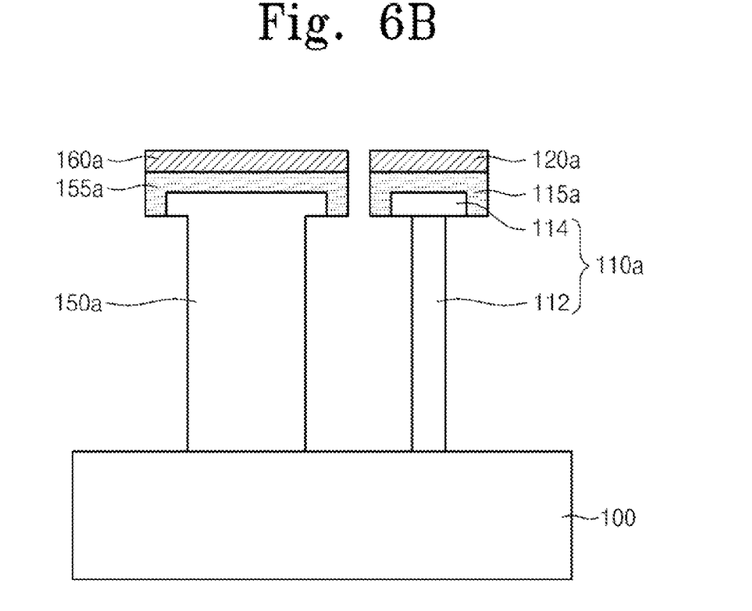

Referring to FIG. 6A and 6B, the electro-mechanical transistor according to an exemplary embodiment of the present invention is described.

A source electrode 140a and a drain electrode 160a are spaced apart from each other on a substrate 100. The substrate 100 is a semiconductor substrate. The moveable channel (gate) 120a is disposed on the substrate. A gate nano-pillar 110a is disposed between the moveable channel 120a and the substrate 100. The gate nano-pillar 110a includes a flexible part 112 extending from the substrate 100, and a capacitive coupling part 114 contacting the flexible part 112. The cross-sectional area of the capacitive coupling part 114 is greater than that of the flexible part 112. Due to the capacitive coupling part 114, capacitive coupling of the gate nano-pillar 110a to the moveable channel 120a is increased. A first dielectric layer 115a is disposed between the moveable channel 120a and the gate nano-pillar 110a.

The moveable channel 120a faces the source electrode 140a and the drain electrode 160a. The moveable channel 120a, the source electrode 140a and the drain electrode 160a are of a conductive material. In an exemplary embodiment, the moveable channel 120, the source electrode 140 and the drain electrode 160 are one of metal, conductive polymer, or doped silicon. In an exemplary embodiment of the present invention, the moveable channel 120, the source electrode 140 and the drain electrode 160 are of aluminum.

The first dielectric layer 115a is an insulating layer. In an exemplary embodiment, the first dielectric layer 115a is a silicon nitride layer. The gate nano-pillar 110a is a flexible material that is bendable in response to an electrostatic force. In an exemplary embodiment the gate nano-pillar 110a is of the same material as the moveable channel 120a, for example, a conductive material. The gate nano-pillar 110 can also be one of various materials such as polymer, a silicon oxide layer, polysilicon, amorphous silicon, photoresist, or a nanotube.

A source pillar 130a is disposed between the substrate 100 and the source electrode 140a. A drain pillar 150a is disposed between the substrate 100 and the drain electrode 160a. The source pillar 130a and the drain pillar 150a are of the same material as the gate nano-pillar 110a. A second dielectric layer 135a is disposed between the source pillar 130a and the source electrode 140a. A third dielectric layer 155a is disposed between the drain pillar 150a and the drain electrode 160a. The second dielectric layer 135a and the third dielectric layer 155a are of the same material as the first dielectric layer 115. In an exemplary embodiment, the second dielectric layer 135a and the third dielectric layer 155a are a silicon nitride layer.

According to the exemplary embodiment of the present invention, capacitive coupling of the gate nano-pillar 110a to the moveable channel 120a is increased. Therefore, the moveable channel 120a can be more easily moved toward the source and drain electrodes 140, 160.

Figure 7:
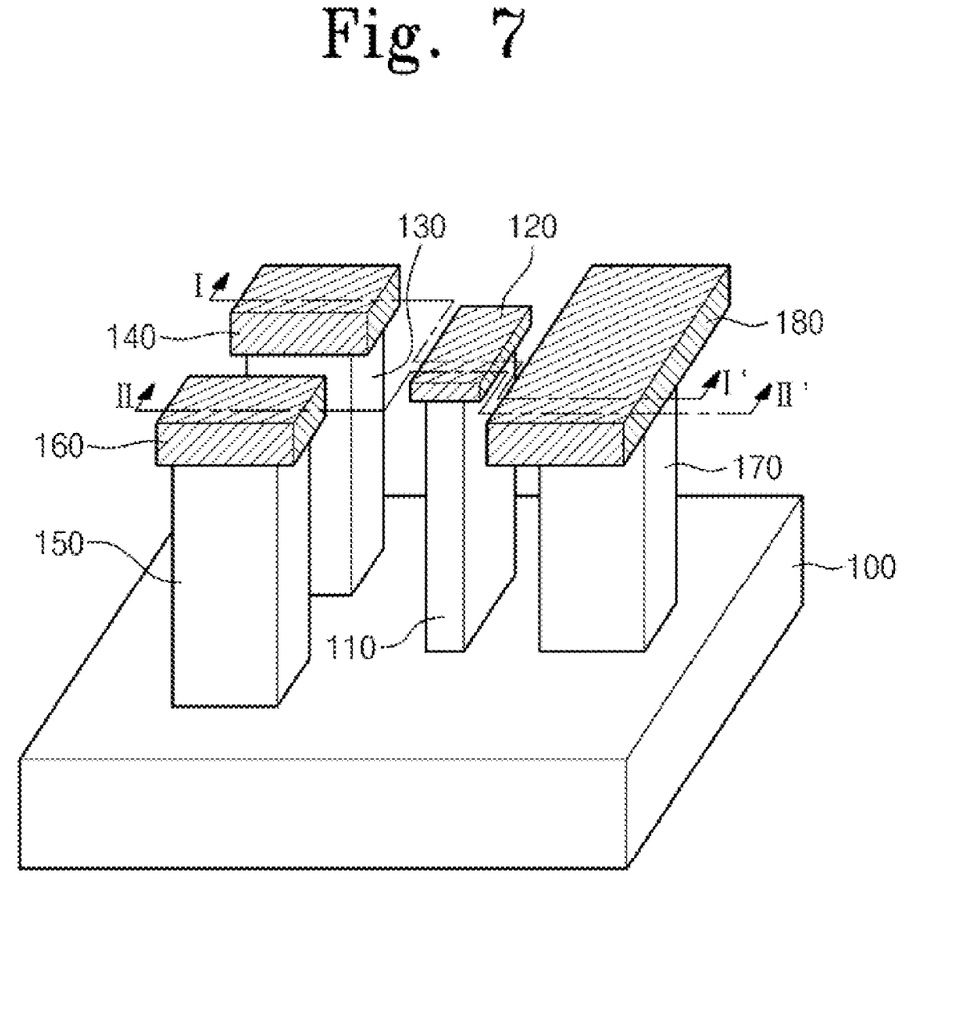
FIG. 7 is a view of an electro-mechanical transistor according to an exemplary of the present invention.
Figure 8A:
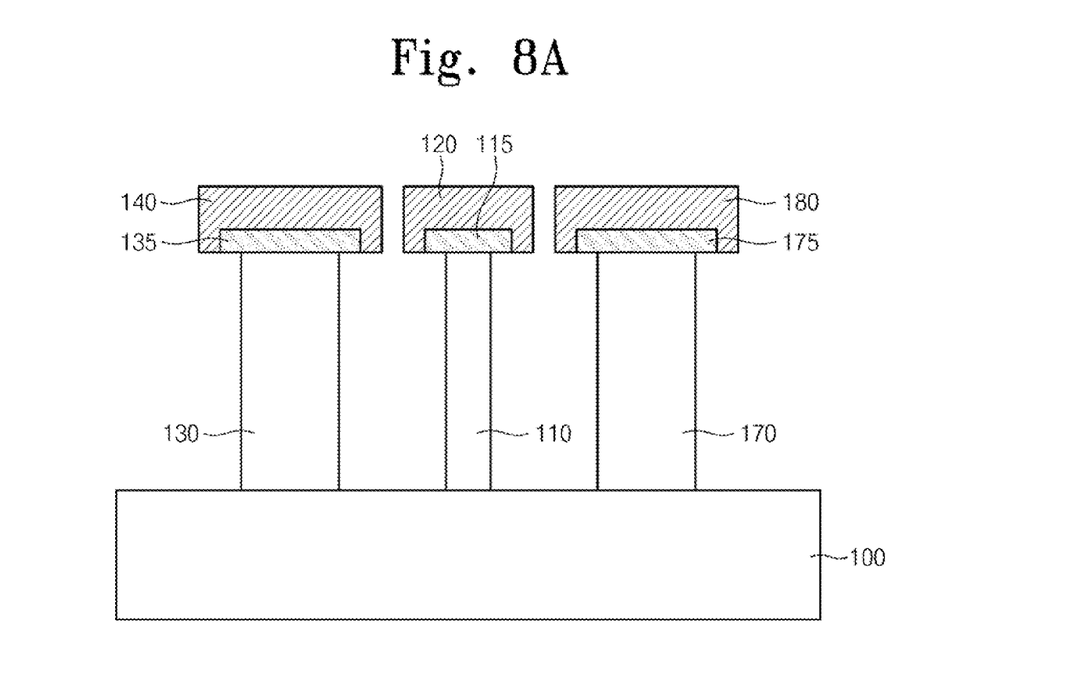
FIGS. 8A and 8B are cross sectional views of an exemplary embodiment taken along line I-I' and along line II-II' of FIG. 7, respectively.
Figure 8B:
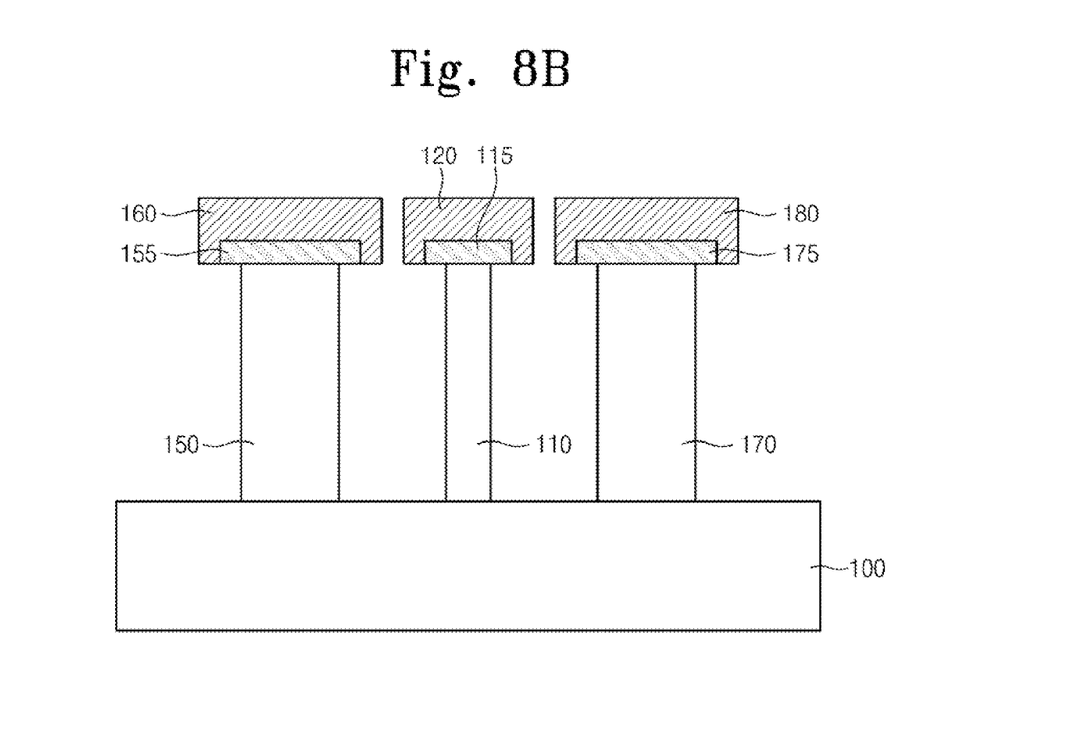

Referring now to FIGS. 7 through 8B, the electro-mechanical transistor according to an exemplary embodiment of the present invention is described.

Source electrode 140 and drain electrode 160 are spaced apart from each other on a substrate 100. The substrate 100 is a semiconductor substrate. The moveable channel 120 (gate) is disposed on the substrate. A gate nano-pillar 110 is disposed between the moveable channel 120 and the substrate 110. A first dielectric layer 115 is disposed between the moveable channel 120 and the gate nano-pillar 110.

The moveable channel 120 faces the source electrode 140 and the drain electrode 160. The moveable channel 120, the source electrode 140 and the drain electrode 160 are of a conductive material. In an exemplary embodiment the moveable channel 120, the source electrode 140 and the drain electrode 160 are one of metal, conductive polymer, or doped silicon. According to exemplary embodiments of the present invention, the moveable channel 120, the source electrode 140 and the drain electrode 160 can be aluminum.

The first dielectric layer 115 is an insulating layer. In an exemplary embodiment the first dielectric layer 115 is a silicon nitride layer. The gate nano-pillar 110 is a flexible material that is bendable in response to an electrostatic force. The gate nano-pillar 110 can be of the same material as the moveable channel 120, for example, a conductive material. The gate nano-pillar 110 can also be one of various materials such as polymer, a silicon oxide layer, polysilicon, amorphous silicon, photoresist, or a nanotube.

Source pillar 130 is disposed between the substrate 100 and the source electrode 140. Drain pillar 150 is disposed between the substrate 100 and the drain electrode 160. The source pillar 130 and the drain pillar 150 are of the same material as the gate nano-pillar 110. Second dielectric layer 135 is disposed between the source pillar 130 and the source electrode 140. Third dielectric layer 155 is disposed between the drain pillar 150 and the drain electrode 160. The second dielectric layer 135 and the third dielectric layer 155 are of the same material as the first dielectric layer 115. In an exemplary embodiment, the second dielectric layer 135 and the third dielectric layer 155 are a silicon nitride layer.

A side gate electrode 180 is disposed on the substrate 100. The side gate electrode 180 faces the source electrode 140 and the drain electrode 160. The moveable channel 120 is interposed between the source electrode 140 and the side gate electrode 180, and between the drain electrode 160 and the side gate electrode 180. The side gate electrode 180 is of the same material as the moveable channel 120. A side gate pillar 170 is disposed between the side gate electrode 180 and the substrate 100. A fourth dielectric layer 175 is disposed between the side gate electrode 180 and the side gate pillar 170.

The method of operating an electro-mechanical transistor according to the exemplary embodiment of the present invention depicted in FIGS. 7-8B will now be described.

By applying a turn-on voltage to the gate nano-pillar 110, the gate nano-pillar 110 establishes the moveable channel 120 at a voltage near the turn-on voltage. If the moveable channel 120 has zero net charge initially, the voltage needed to deflect the gate nano-pillar 110 toward the source and drain electrodes 140, 160 will be increased due to the symmetry brought by the side gate electrode 180 as compared with the exemplary embodiments of the present invention depicted in FIGS. 1-6B.

However, the side gate electrode 180 also creates an additional electrostatic force on the moveable channel 120 in the opposite direction of that produced by the source and drain electrodes 140, 160. The additional electrostatic force can be utilized once the moveable channel 120 contacts the source and drain electrodes 140, 160. That is, the additional electrostatic force can help restore the moveable channel 120.

The side gate pillar 170 can be tied with the gate nano-pillar 110 when biasing the electro-mechanical transistor such that the moveable channel 120 experiences a greater restoring force when the moveable channel 120 contacts the source and drain electrodes 140, 160.

There are two potential modes of operation for the electro-mechanical transistor. The first mode is useful for volatile or non-volatile memory device. The first mode utilizes stiction force, that is, the static friction that prevents relative motion of objects in contact, to retain a memory state. If the electro-mechanical transistor is such that the moveable channel 120 remains in intimate contact with the source and drain electrodes 140, 160 due to a stiction force (for example, van der waals interaction), then the memory state is retained. The stiction force must be greater than the restoring force of the gate nano-pillar for the electro-mechanical transistor to operate as a non-volatile memory device.

In the second mode of operation, a constant bias to the gate nano-pillar 110 is used to continuously oscillate the moveable channel 120. The side gate pillar 170 can be tied with the gate nano-pillar 110 when biasing so that the moveable channel 120 experiences a greater restoring force when the moveable channel 120 is in contact with the source and drain electrodes 140, 160. The restoring force is from additional electrostatic force and is larger once the moveable channel 120 obtains a net charge from the source and drain electrodes 140, 160. Additionally, the restoring force from additional electrostatic force can aid the restoring force of the gate nano-pillar 110 in overcoming the stiction force.

Figure 9A:
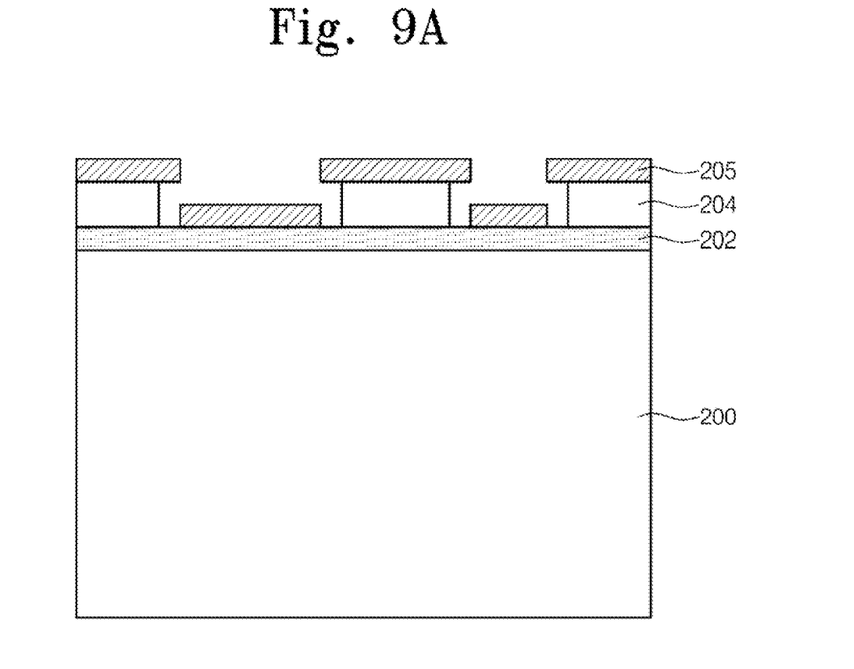
FIGS. 9A, 9B, 9C, 9D and 9E are views illustrating a method of forming an electro-mechanical transistor according to an exemplary embodiment of the present invention.
Figure 9B:
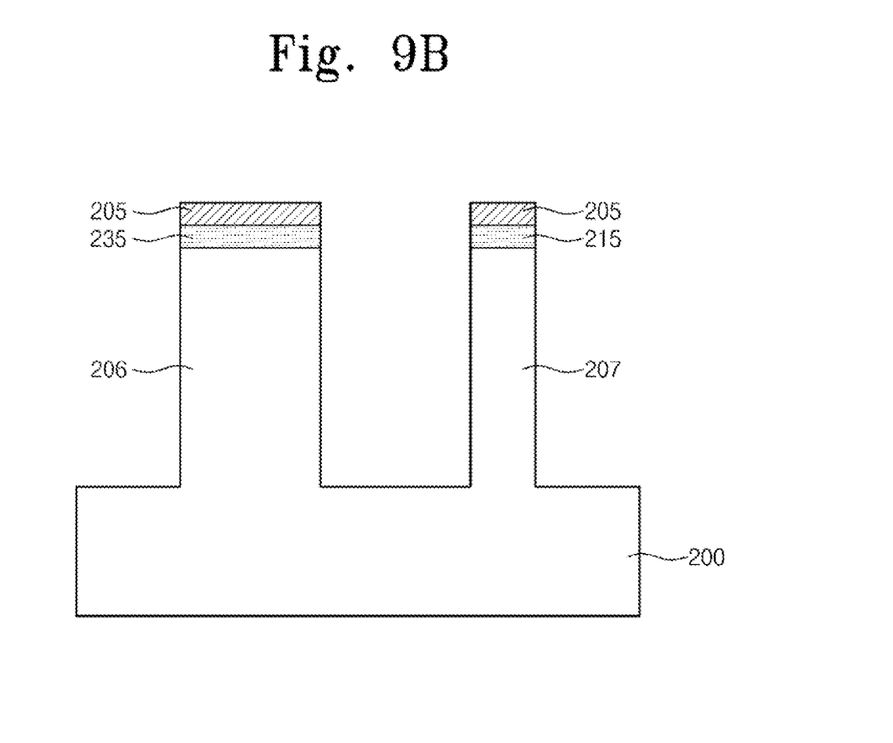
Figure 9C:
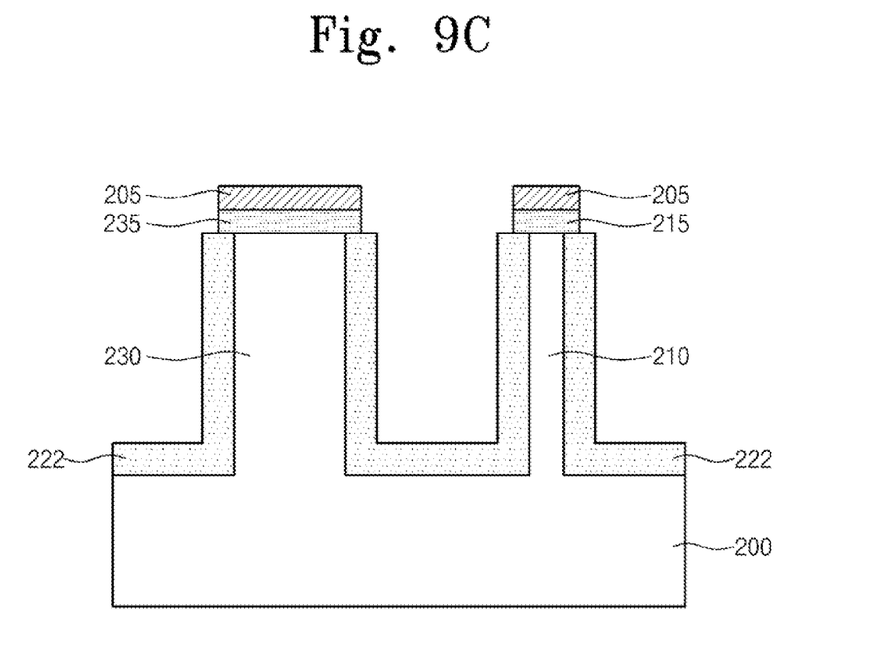

FIGS. 9A, 9B and 9C are views illustrating a method of forming an electro-mechanical transistor according to an exemplary embodiment of the present invention.

Referring to FIG. 9A, an insulating layer 202 is formed on a substrate 200. The insulating layer 202 is formed of silicon nitride layer. The insulating layer 202 is formed by performing low pressure chemical vapor deposition process. The insulating layer 202 not only serves as the insulating spacer between a moveable channel and a gate nano-pillar, but also as the diffusion barrier for the subsequent oxidation of silicon.

A photoresist pattern 204 is formed on the insulating layer 202. The photoresist pattern 204 may have opening parts. A hard mask layer 205 is formed on the photoresist pattern 204 and the insulating layer 202. The hard mask layer 205 is partially formed in opening parts, and partially remains on the photoresist pattern 204.

Referring to FIG. 9B, the photoresist pattern 204 is removed through a lift-off process. As a result of the lift-off process, the hard mask layer 205 on the photoresist pattern 204 is removed. The etching process is performed on the substrate 200 by using the hard mask layer 205 as a mask, to form a first dielectric layer 215, a second dielectric layer 235, a preliminary gate nano-pillar 207 and a preliminary source pillar 206. The etching process may be highly anisotropic dry etch to form high aspect ratio features in silicon.

Figure 9D:
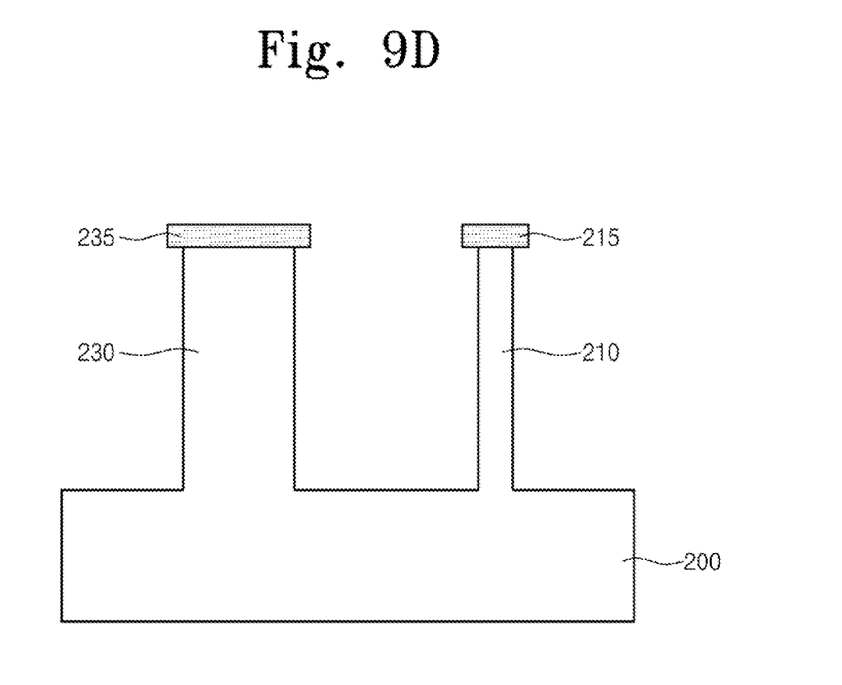

Referring to FIGS. 9C and 9D, an oxidation process is performed on the preliminary gate nano-pillar 207, the preliminary source pillar 206 and the substrate 200 to form a gate nano-pillar 210 and a source pillar 230. After performing of the oxidation process, a wet etching is performed to remove an oxide layer 222 by using a hydrogen fluoride (HF) solution. The oxidation process and the wet etching can be performed repeatedly to controllably shrink the minimum feature size. A phenomena known as self-limiting oxidation can be used to form the gate nano-pillar 210 of the smallest possible diameter, for example 5 nm. After performing of the wet etching, the hard mask layer 205 is removed.

Figure 9E:
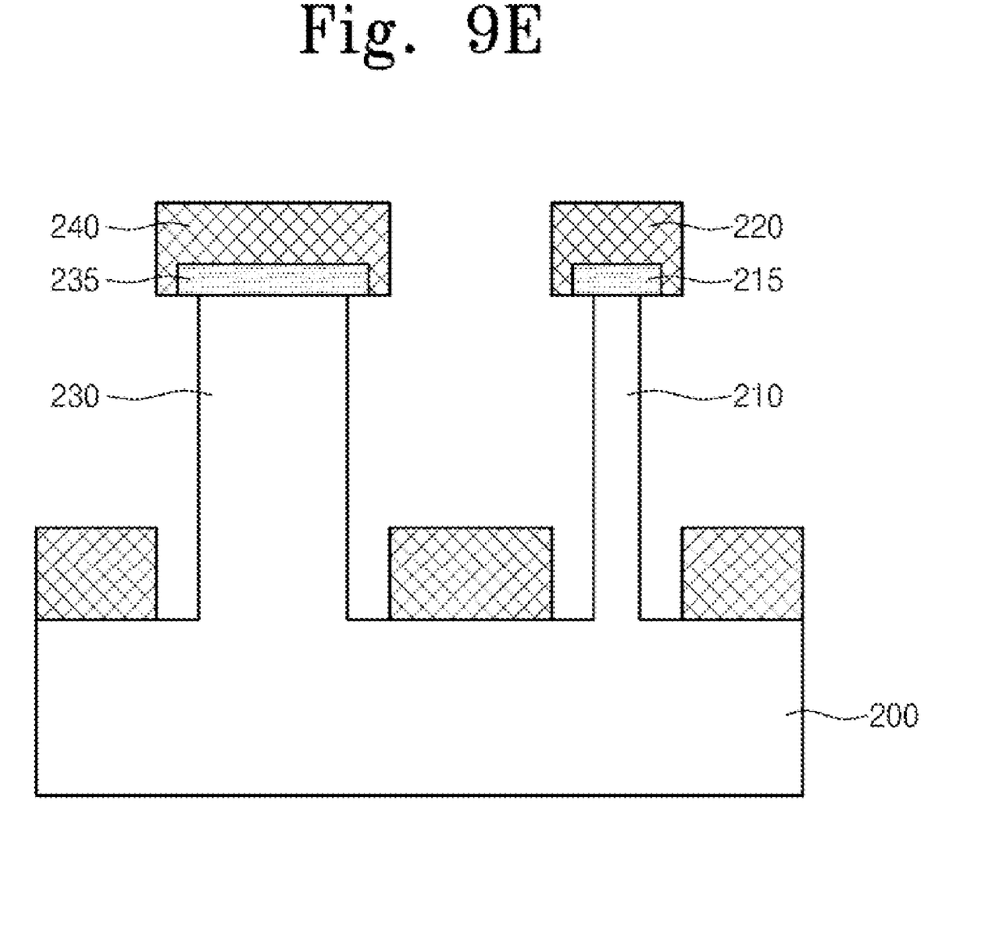

Referring to FIG. 9E, a source electrode 240 and a moveable channel 220 is formed on the first dielectric layer 215 and the second dielectric layer 235. The source electrode 240 and the moveable channel 220 may be formed by performing a Physical Vapor Deposition (PVD) process. The PVD process may include an evaporation method or a sputtering method. The PVD process also reduces the interval of the air gap between the source electrode 240 and the moveable channel 220.

Although a drain pillar is not shown in FIGS. 9A and 9E, the drain pillar is formed by performing the same method as that of forming the source pillar.

Figure 10A:
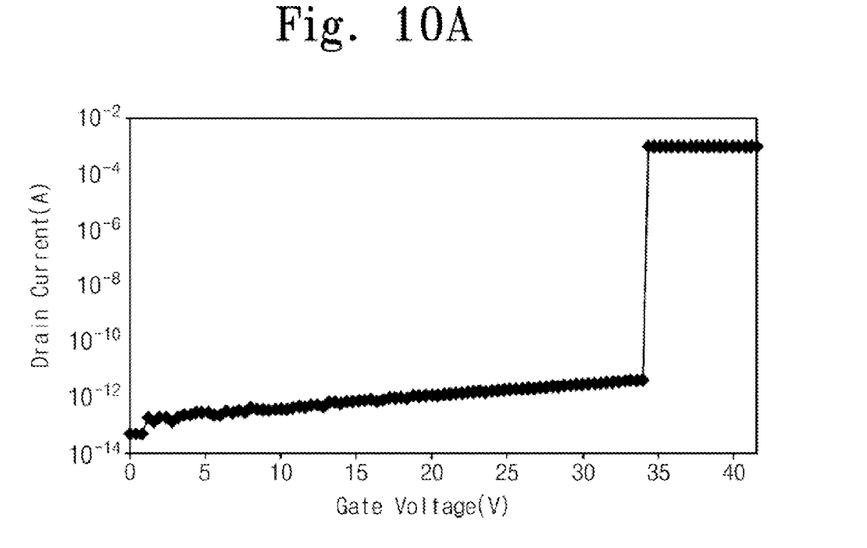
FIG. 10A is a graph illustrating a current-voltage characteristic of an electro-mechanical transistor according to an embodiment of the present invention.
Figure 10B:
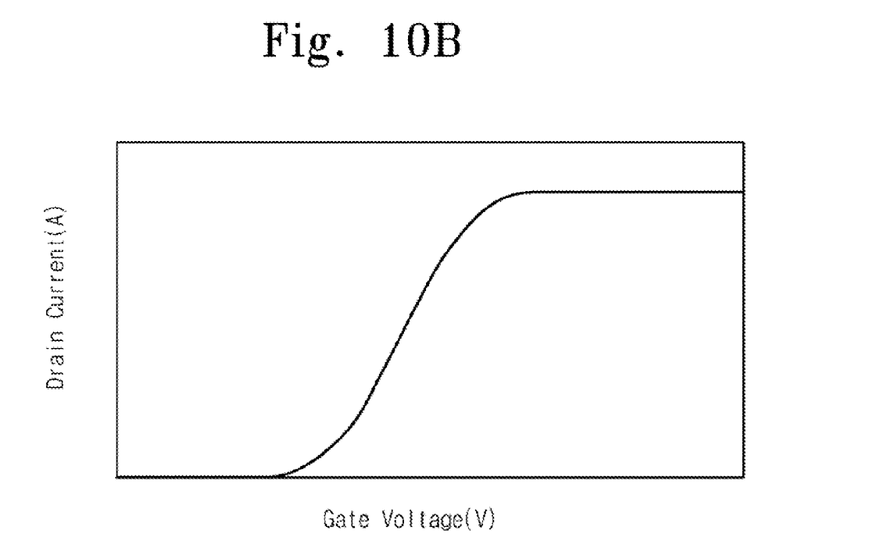
FIG. 10B is a graph illustrating a current-voltage characteristic of a conventional MOSFET.

FIG. 10A is a graph illustrating a current-voltage characteristic of an electro-mechanical transistor according to an exemplary embodiment of the present invention. FIG. 10B is a graph illustrating a current-voltage characteristic of a conventional MOSFET. The x-axis represents a gate voltage applied to a gate electrode, and the y-axis represents a drain current. As shown in FIG. 10A, the ratio of a turn-on current and a turn-off current is improved compared with a conventional MOSFET in shown FIG. 10B. This is not because a transistor is switched as a result of electron movement but because a source electrode is connected to a drain electrode mechanically using a moveable channel.

Figure 11:
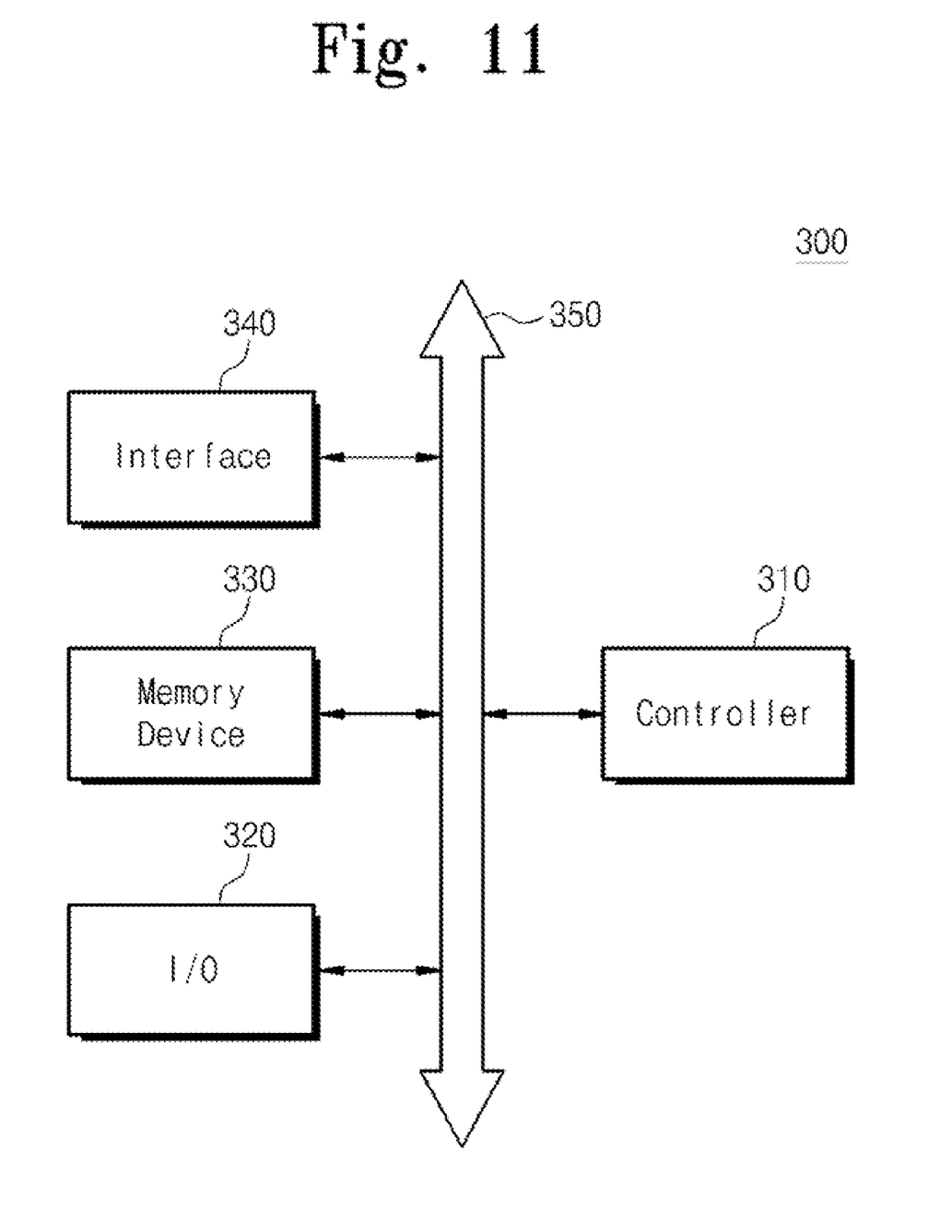
FIG. 11 is a block diagram illustrating an electronic system which can include an electro-mechanical transistor according to at least one exemplary embodiment of the present invention.

FIG. 11 is a block diagram illustrating an electronic system which has an electro-mechanical transistor in accordance with the above-described embodiments of the present invention. An electronic system 300 includes a controller 310, an input/output device 320, and a memory device 330. The controller 310, the input/output device 320, and the memory device 330 are coupled to each other through a bus 350. The bus 350 corresponds to a path through which data and/or operation signals transfer. The controller 310 includes at least one of a microprocessor, a digital signal processor, a microcontroller, or logic devices capable of performing similar functions thereof. The input/output device 320 includes at least one of a keypad, a keyboard, or a display device. The memory device 330 stores data. The memory device 330 stores data and/or commands executed by the controller 310. The memory device 330 includes at an electro-mechanical transistor in accordance with at least one of the exemplary embodiments of the present invention described and depicted hereinabove. The electronic system 300 further includes an interface 340 for transmitting or receiving data via a communication network. The interface 340 can be in a wire or wireless form. For example, the interface 340 can be an antenna or a wire/wireless transceiver.

The electronic system 300 can be realized with a mobile system, a personal computer, an industrial computer, or a system performing various functions. For example, the mobile system can be a personal digital assistant (PDA), a portable computer, a web tablet, a mobile phone, a wireless phone, a laptop computer, a memory card, a digital music system, or an information transmitting/receiving system. If the electronic system 300 is capable of performing wireless communication, it may be used in communication interface protocols of a three-generation communication system such as Code Division Multiple Access (CDMA), Global System for Mobile Communications (GSM), North American Digital Cellular (NADC), Extended-Time Division Multiple Access (E-TDMA), and CDMA2000.

Figure 12:
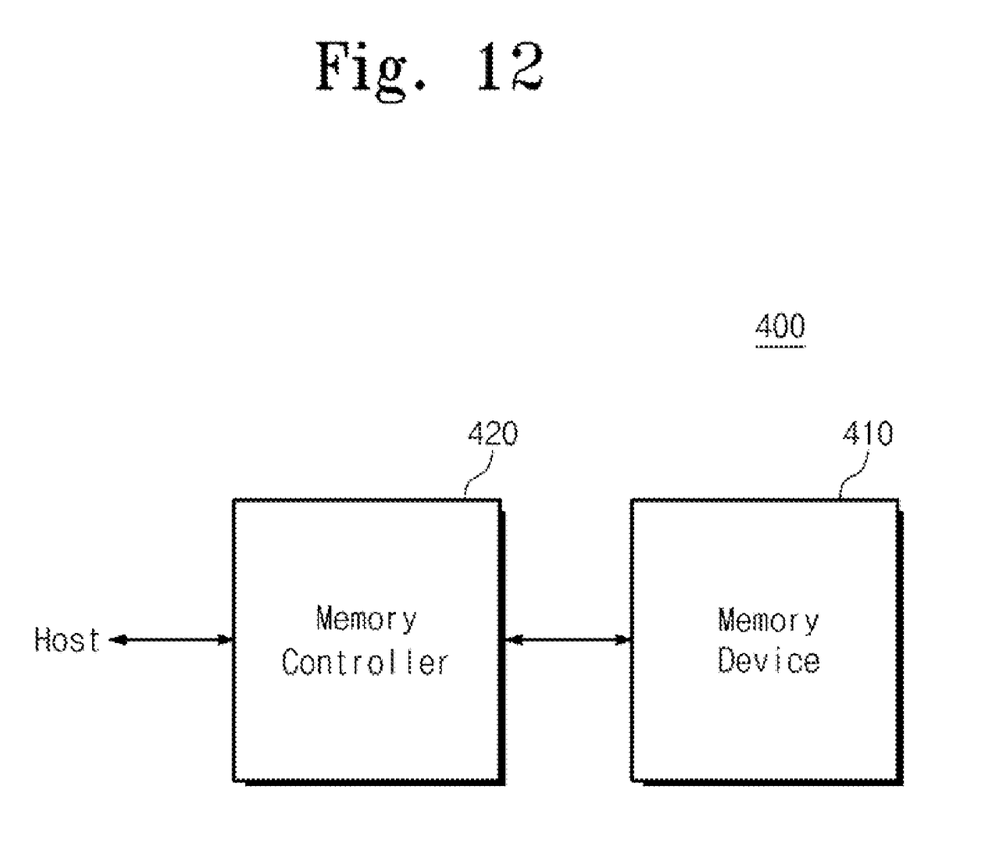
FIG. 12 is a block diagram illustrating a memory card which can include an electro-mechanical transistor according to at least one exemplary embodiment of the present invention.

FIG. 12 is a block diagram illustrating a memory card having an electro-mechanical transistor in accordance with at least one of the exemplary embodiments of the present invention described and depicted hereinabove. A memory card 400 includes a memory device 410 and a memory controller 420. The memory device 410 stores data. The memory device 410 may have a non-volatile characteristic where stored data remains even when there is no power. The memory device 410 may include the electro-mechanical transistor of the above-described embodiments. The memory controller 420 reads data stored in the memory device 410 or stores data in the memory device 410 in response to a read/write request of a host.

According to the exemplary embodiments of the present invention, an electro-mechanical transistor includes a moveable channel (gate). Because of the moveable channel, a short channel effect occurring in MOSFETs, particularly when electronic devices utilizing MOSFETs are scaled down, can be avoided. Accordingly, an electro-mechanical transistor can achieve operational reliability.

The above-disclosed subject matter is to be considered illustrative, and not restrictive, and the appended claims are intended to cover all such modifications, enhancements, and other exemplary embodiments, all of which fall within the spirit and scope of the present invention as set forth by the following claims.

What is claimed is:

1. An electro-mechanical transistor comprising:
   a substrate;
   a source electrode and a drain electrode spaced apart from each other;
   a source pillar between the substrate and the source electrode;
   a drain pillar between the substrate and the drain electrode;
   a moveable channel spaced apart from the source electrode and the drain electrode;
   a gate nano-pillar between the moveable channel and the substrate;
   a first dielectric layer between the moveable channel and the gate nano-pillar;
   a second dielectric layer between the source pillar and the source electrode; and
   a third dielectric layer between the drain pillar and the drain electrode.

2. The electro-mechanical transistor of claim 1, wherein the gate nano-pillar comprises a flexible material that is bendable in response to an electrostatic force.

3. The electro-mechanical transistor of claim 1, wherein the source electrode and the drain electrode are electrically connectable to the moveable channel as a result of movement of the moveable channel caused by an electrostatic force that is generated by applying a turn-on voltage to the gate nano-pillar.

4. The electro-mechanical transistor of claim 1,
wherein the gate nano-pillar comprises a flexible part that extends from the substrate and a capacitive coupling part that contacts the flexible part, and
wherein a cross-sectional area of the capacitive coupling part is greater than a cross- sectional area of the flexible part.

5. The electro-mechanical transistor of claim 1, further comprising:
a side gate electrode on the substrate, the side gate electrode facing the source electrode and the drain electrode,
wherein the moveable channel is interposed between the source electrode and the side gate electrode, and between the drain electrode and the side gate electrode.

6. The electro-mechanical transistor of claim 5, wherein the side gate electrode creates an additional electrostatic force in a direction opposite of a direction from the moveable channel to the source electrode and drain electrode.

7. The electro-mechanical transistor of claim 6, wherein the additional electrostatic force restores the moveable channel when the moveable channel is in contact with the source electrode and the drain electrode.

8. The electro-mechanical transistor of claim 1, wherein the source electrode, the drain electrode, the gate nano-pillar, and the moveable channel form a memory cell.

9. The electro-mechanical transistor of claim 8, wherein the memory cell retains a state using stiction force and molecular force to maintain physical contact resulting from an electrostatic force generated by applying a turn-on voltage to the gate nano-pillar.

10. An electro-mechanical transistor comprising:
a substrate;
a source electrode on a source pillar that separates the source electrode from the substrate;
a drain electrode on a drain pillar that separates the drain electrode from the substrate and from the source electrode;
a gate electrode on a gate pillar that separates the gate electrode from the substrate and from the source electrode and the drain electrode;
a source dielectric layer between the source electrode and the source pillar,
a drain dielectric layer between the drain electrode and the drain pillar; and
a gate dielectric layer between the gate electrode and the gate pillar,
wherein the gate pillar is a flexible material such that the gate pillar is bendable toward the source electrode and toward the drain electrode by an electrostatic force that is generated when a turn-on voltage is applied to the gate pillar.

11. The electro-mechanical transistor of claim 10, wherein when the turn-on voltage is applied to the gate pillar, the gate pillar is bendable toward the source electrode and toward the drain electrode such that the gate electrode contacts the source electrode and the drain electrode.

12. An electro-mechanical transistor comprising:
a substrate;
a source electrode on a source pillar that separates the source electrode from the substrate;
a drain electrode on a drain pillar that separates the drain electrode from the substrate and from the source electrode;
a first gate electrode on a first gate pillar that separates the gate electrode from the substrate and from the source electrode and the drain electrode;
a second gate electrode on a second gate pillar;
wherein the first gate electrode is located:
between the second gate electrode and the source electrode, and
between the second gate electrode and the drain electrode,
wherein the first gate pillar is a flexible material such that the first gate pillar is bendable toward the source electrode and toward the drain electrode by an electrostatic force that is generated when a turn-on voltage is applied to the first gate pillar, and
wherein the second gate electrode provides a restoring electrostatic force when the turn on voltage is applied to the second gate pillar.

13. The electro-mechanical transistor of claim 12, wherein when the turn-on voltage is applied to the first gate pillar, the first gate pillar is bendable toward the source electrode and toward the drain electrode such that the gate electrode contacts the source electrode and the drain electrode.

14. The electro-mechanical transistor of claim 12, further comprising:
a source dielectric layer between the source electrode and the source pillar,
a drain dielectric layer between the drain electrode and the drain pillar;
a first gate dielectric layer between the first gate electrode and the first gate pillar; and
a second dielectric layer between the second gate electrode and the second gate pillar.

\* \* \* \* \*

UNITED STATES PATENT AND TRADEMARK OFFICE
CERTIFICATE OF CORRECTION

| | | |
|---|---|---|
| PATENT NO. | : 8,080,839 B2 | Page 1 of 1 |
| APPLICATION NO. | : 12/549906 | |
| DATED | : December 20, 2011 | |
| INVENTOR(S) | : Sandip Tiwari et al. | |

It is certified that error appears in the above-identified patent and that said Letters Patent is hereby corrected as shown below:

Title page item (73),

THE CO-ASSIGNEE: CORNELL UNIVERSITY, ITHACA, NEW YORK, WAS OMITTED

THE ASSIGNEE INFORMATION SHOULD READ:

SAMSUNG ELECTRONICS CO., LTD.
CORNELL UNIVERSITY

Signed and Sealed this
Twenty-first Day of July, 2015

Michelle K. Lee
*Director of the United States Patent and Trademark Office*